US011600935B2

(12) United States Patent
Kimura

(10) Patent No.: US 11,600,935 B2
(45) Date of Patent: Mar. 7, 2023

(54) LOCATOR, CONNECTOR AND HARNESS

(71) Applicant: Japan Aviation Electronics Industry, Limited, Tokyo (JP)

(72) Inventor: Masaki Kimura, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 14 days.

(21) Appl. No.: 17/365,114

(22) Filed: Jul. 1, 2021

(65) Prior Publication Data

US 2022/0069490 A1    Mar. 3, 2022

(30) Foreign Application Priority Data

Aug. 28, 2020  (JP) .............................. JP2020-144688

(51) Int. Cl.
| | |
|---|---|
| *H01R 12/53* | (2011.01) |
| *H01R 12/70* | (2011.01) |
| *H01R 13/502* | (2006.01) |
| *H01R 9/03* | (2006.01) |
| *H01R 24/62* | (2011.01) |

(52) U.S. Cl.
CPC ............... *H01R 12/53* (2013.01); *H01R 9/03* (2013.01); *H01R 12/7052* (2013.01); *H01R 13/502* (2013.01); *H01R 24/62* (2013.01)

(58) Field of Classification Search
CPC ...... H01R 12/53; H01R 9/03; H01R 12/7052; H01R 13/502; H01R 24/62; H01R 13/6658; H01R 13/665; H05K 3/301; H05K 2201/10356

See application file for complete search history.

(56) References Cited

U.S. PATENT DOCUMENTS

| | | | |
|---|---|---|---|
| 7,465,183 B2 * | 12/2008 | Hashiguchi | H01R 9/2416 |
| | | | 439/942 |
| 9,843,143 B2 | 12/2017 | Wu et al. | |
| 10,348,032 B2 * | 7/2019 | Yamaguchi | H01R 24/64 |
| 11,050,186 B2 * | 6/2021 | Toda | H01R 13/506 |
| 2018/0261956 A1 * | 9/2018 | Yamaguchi | H01R 12/53 |
| 2019/0393656 A1 * | 12/2019 | Wu | H01R 12/53 |
| 2021/0021081 A1 * | 1/2021 | Toda | H01R 13/5812 |
| 2022/0069490 A1 * | 3/2022 | Kimura | H01R 12/53 |

FOREIGN PATENT DOCUMENTS

| | | |
|---|---|---|
| CN | 204243228 U | 4/2015 |
| CN | 210224464 U | 3/2020 |
| JP | 2018-152244 A | 9/2018 |

* cited by examiner

*Primary Examiner* — Abdullah A Riyami
*Assistant Examiner* — Nader J Alhawamdeh
(74) *Attorney, Agent, or Firm* — Collard & Roe, P.C.

(57) ABSTRACT

A locator is for aligning cables which are configured to be connected with a circuit board having an accommodated portion. The locator comprises at least a main portion which extends in a pitch direction. The main portion is, at least in part, formed with at least one circuit board accommodating portion. The main portion is formed with at least one first through hole and at least one second through hole which is different from the first through hole. The at least one circuit board accommodating portion is configured to accommodate the accommodated portion of the circuit board. The at least one circuit board accommodating portion opens at least forward in a front-rear direction perpendicular to the pitch direction. In the pitch direction, the at least one first through hole is provided at a location which is different from a location of the circuit board accommodating portion.

11 Claims, 8 Drawing Sheets

LOCATOR, CONNECTOR AND HARNESS

CROSS REFERENCE TO RELATED APPLICATIONS

This application is based on and claims priority under 35 U.S.C. § 119 to Japanese Patent Application No. JP2020-144688 filed Aug. 28, 2020, the contents of which are incorporated herein in their entirety by reference.

BACKGROUND OF THE INVENTION

This invention relates to a locator for aligning cables which are configured to be connected with a circuit board.

Referring to FIGS. 15 and 16, JPA2018-152244 (Patent Document 1) discloses a connector 900 which is configured to be connected with a composite cable 950 including a plurality of cables 960. Specifically, the connector 900 comprises a mating portion 910, a circuit board 920, a locator 930 and a back shell 940. The mating portion 910 is configured to be mated with a mating connector, which is not shown in the figure, along a front-rear direction. In the figure, the front-rear direction is a Y-direction. The circuit board 920 is connected with the mating portion 910. The circuit board 920 is formed with a plurality of pads 922. The circuit board 920 is provided with an accommodated portion 924. The locator 930 has a circuit board accommodating portion 932 and a plurality of through holes 934. Specifically, the circuit board accommodating portion 932 opens forward. In the figure, forward is a negative Y-direction. The accommodated portion 924 of the circuit board 920 is accommodated in the circuit board accommodating portion 932 of the locator 930. The cables 960 included in the composite cable 950 are held by the through holes 932, respectively, of the locator 930 and are thereby positioned both in a pitch direction and in an up-down direction. In the figure, the pitch direction is an X-direction while the up-down direction is a Z-direction. A core wire 962 of the cable 960 is connected with the pad 922 of the circuit board 920. The back shell 940 is attached to a rear end part of the mating portion 910 so as to cover the pads 922 of the circuit board 920.

According to Patent Document 1, the cable 960 and the circuit board accommodating portion 932 overlap with each other in the up-down direction at an area rearward of the through hole 934 of the locator 930. Thus, as an outer diameter of the cable 960 becomes larger, the through hole 934 must be positioned away from the circuit board accommodating portion 932 in the up-down direction in consideration with a positional relationship between an outer periphery of the cable 960 and the circuit board accommodating portion 932. Consequently, according to Patent Document 1, as the outer diameter of the cable 960 becomes larger, the locator 930 has an increased size in the up-down direction and thereby the connector 900 has an increased size in the up-down direction.

SUMMARY OF THE INVENTION

It is an object of the present invention to provide a locator which is provided in a connector and can prevent the connector from having an increased size even if a cable connected with the connector has an increased outer diameter.

One aspect (first aspect) of the present invention provides a locator for aligning cables which are configured to be connected with a circuit board having an accommodated portion. The locator comprises at least a main portion which extends in a pitch direction. The main portion is, at least in part, formed with at least one circuit board accommodating portion. The main portion is formed with at least one first through hole and at least one second through hole which is different from the first through hole. The at least one circuit board accommodating portion is configured to accommodate the accommodated portion of the circuit board. The at least one circuit board accommodating portion opens at least forward in a front-rear direction perpendicular to the pitch direction. Each of the at least one first through hole and the at least one second through hole pierces the main portion in the front-rear direction. Each of the at least one first through hole and the at least one second through hole holds one of the cables to position the one of the cables both in the pitch direction and in an up-down direction which is perpendicular to both the pitch direction and the front-rear direction. In the pitch direction, the at least one first through hole is provided at a location which is different from a location of the circuit board accommodating portion.

Another aspect (second aspect) of the present invention provides a connector comprising a mating portion, the circuit board and the locator of the first aspect. The mating portion is configured to be mated with a mating connector. The circuit board is connected with the mating portion. The circuit board has the accommodated portion. The accommodated portion is accommodated in the circuit board accommodating portion to be positioned both in the pitch direction and in the up-down direction.

Still another aspect (third aspect) of the present invention provides a harness comprising a connector and a composite cable which is connected with the connector. The connector comprises a mating portion, the circuit board and the locator of the first aspect. The mating portion is configured to be mated with a mating connector. The circuit board is connected with the mating portion. The circuit board has the accommodated portion. The accommodated portion is accommodated in the circuit board accommodating portion to be positioned both in the pitch direction and in the up-down direction. The composite cable comprises the cables. The cables are aligned by the locator and are connected with the circuit board.

The locator of the present invention is configured so that, in the pitch direction, the first through hole, which is one of through holes aligning the cables, is provided at the location which is different from the location of the circuit board accommodating portion. Accordingly, the circuit board accommodating portion does not restrict a size of a cable which is held by the first through hole. Thus, without increasing a size of the locator in the up-down direction, the locator of the present invention can align a cable with an increased outer diameter which corresponds to the first through hole. In other words, the locator of the present embodiment prevents a connector from having an increased size even if cables, for example twisted pair lines, which are connected to the connector, have increased outer diameters.

An appreciation of the objectives of the present invention and a more complete understanding of its structure may be had by studying the following description of the preferred embodiment and by referring to the accompanying drawings.

Figure 1:
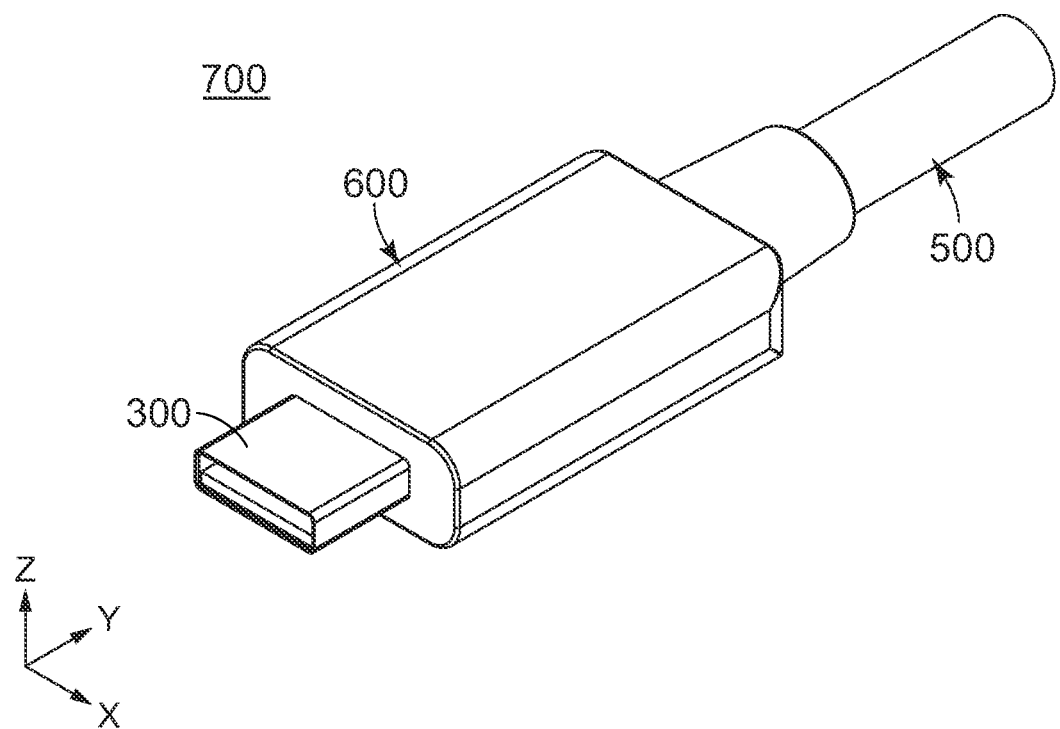
FIG. 1 is a perspective view showing a harness according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

As shown in FIG. 1, a harness 700 according to an embodiment of the present invention comprises a connector 600 and a composite cable 500. The composite cable 500 is connected with the connector 600. In other words, the harness 700 is configured so that the connector 600 is connected with the composite cable 500.

Figure 2:
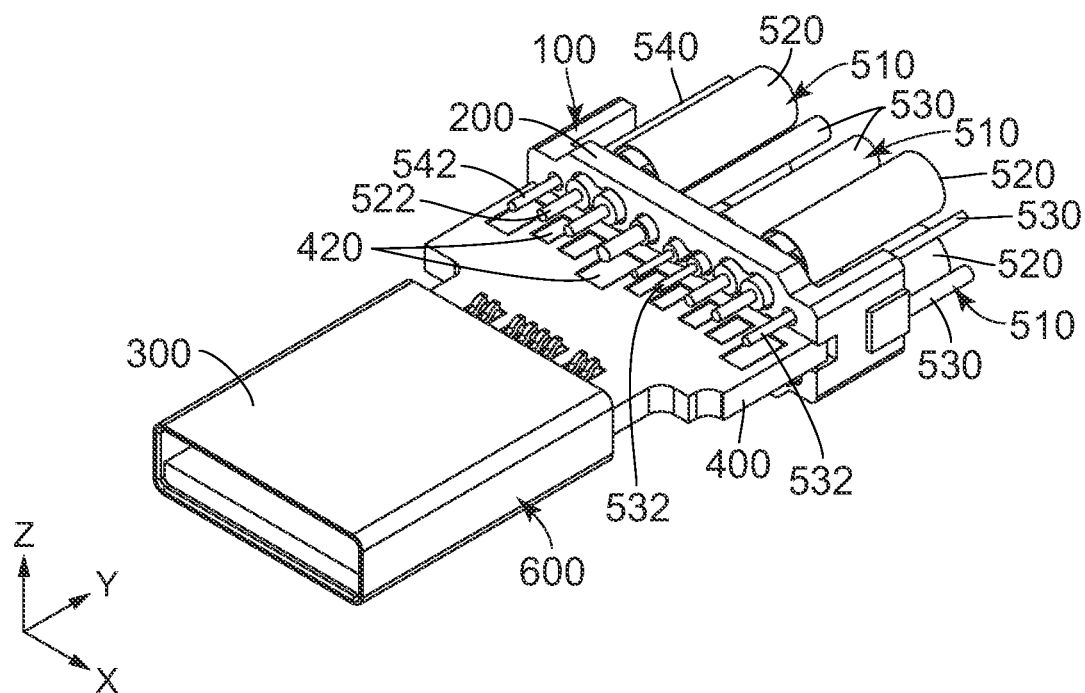
FIG. 2 is another perspective view showing the harness of FIG. 1. In the figure, a resin molding is omitted while signal lines of first cables, core wires of second cables and core wires of third cables are not connected with pads of a circuit board.

Referring to FIGS. 1 and 2, the composite cable 500 of the present embodiment comprises a plurality of cables 510.

Figure 7:
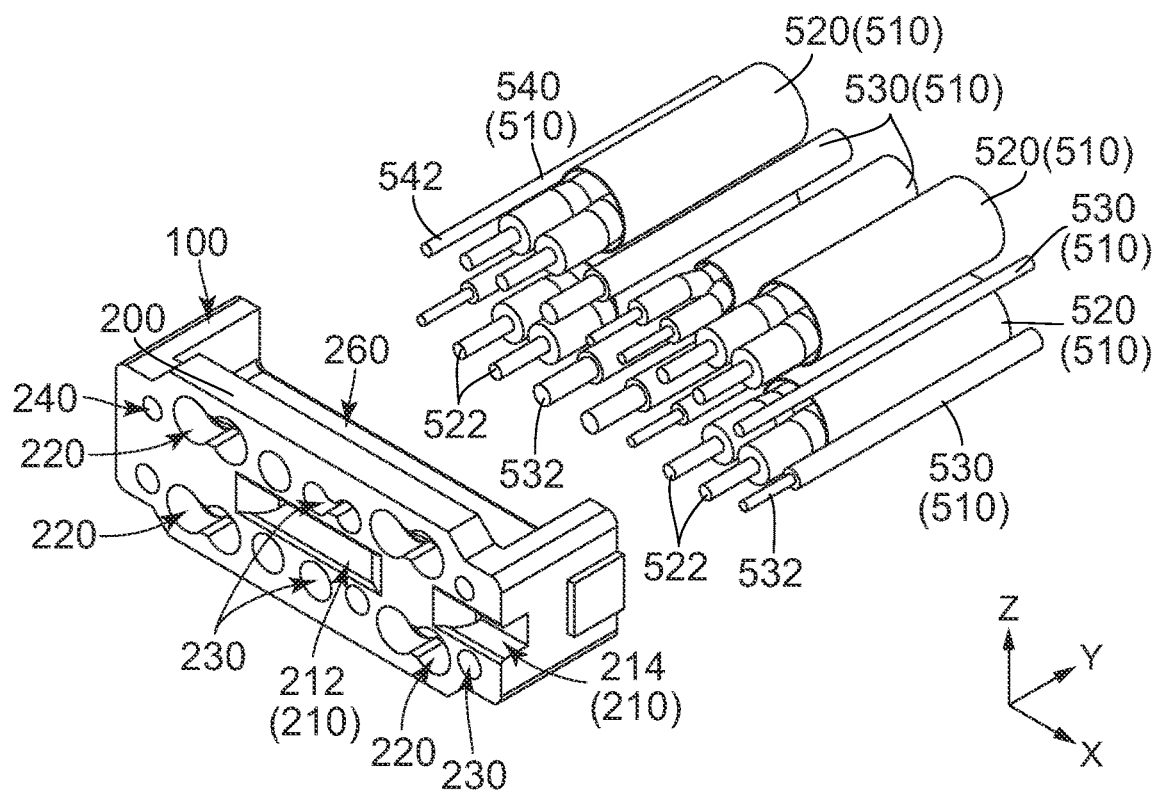
FIG. 7 is a front, perspective view showing the locator and the cables of FIG. 5. In the figure, the first cables, the second cables and the third cables are not held by the first through holes, the second through holes and the third through holes of the locator.
Figure 8:
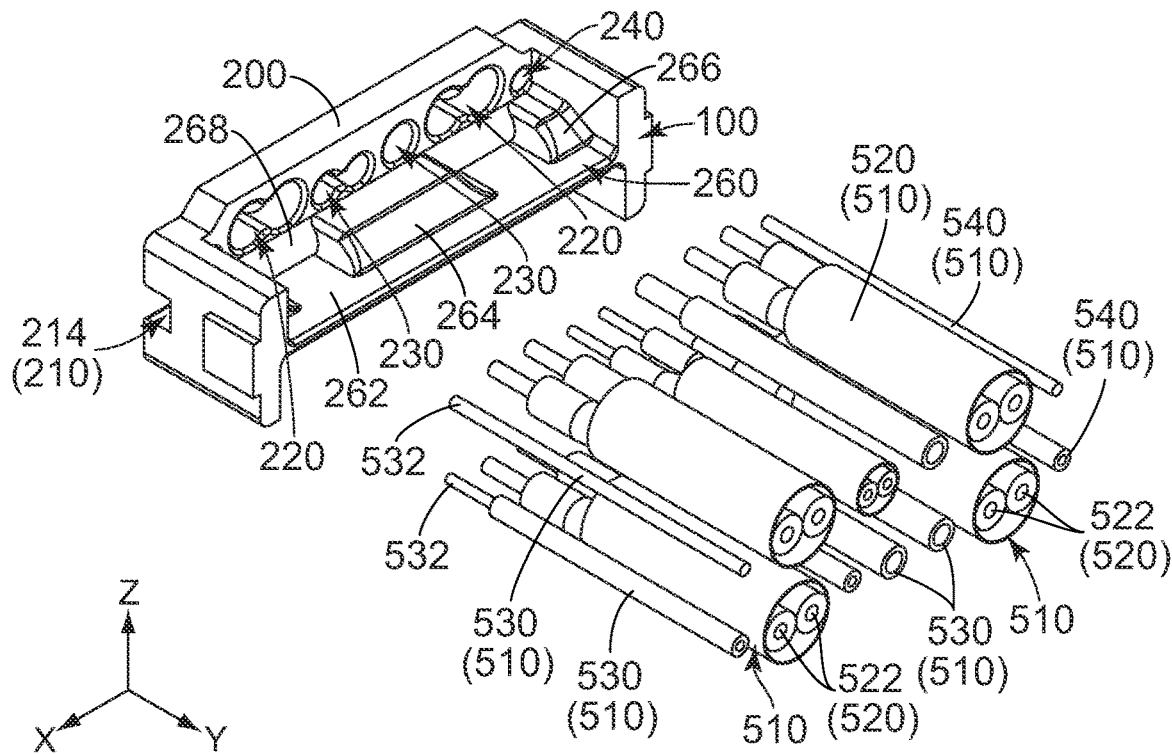
FIG. 8 is a rear, perspective view showing the locator and the cables of FIG. 7.

As shown in FIGS. 7 and 8, each of the cables 510 of the present embodiment extends in a front-rear direction. In the present embodiment, the front-rear direction is a Y-direction. Specifically, it is assumed that forward is a negative Y-direction while rearward is a positive Y-direction. Referring to FIG. 8, the cables 510 include first cables 520 and second cables 530. Specifically, each of the first cables 520 consists of twisted pair lines, and each of the second cables 530 is different from the first cable 520.

As shown in FIG. 8, each of the first cables 520 of the present embodiment extends in the front-rear direction. Each of the first cables 520 has an outer diameter greater than an outer diameter of the second cable 530. Each of the first cables 520 has a pair of signal lines 522.

As shown in FIG. 7, each of the second cables 530 of the present embodiment extends in the front-rear direction. Each of the second cables 530 has a core wire 532.

As shown in FIG. 7, the cables 510 of the present embodiment further include third cables 540 each of which is different from any of the first cable 520 and the second cable 530.

As shown in FIG. 7, each of the third cables 540 of the present embodiment extends in the front-rear direction. Each of the third cables 540 has an outer diameter smaller than the outer diameter of the first cable 520. Each of the third cables 540 has a core wire 542.

Figure 3:
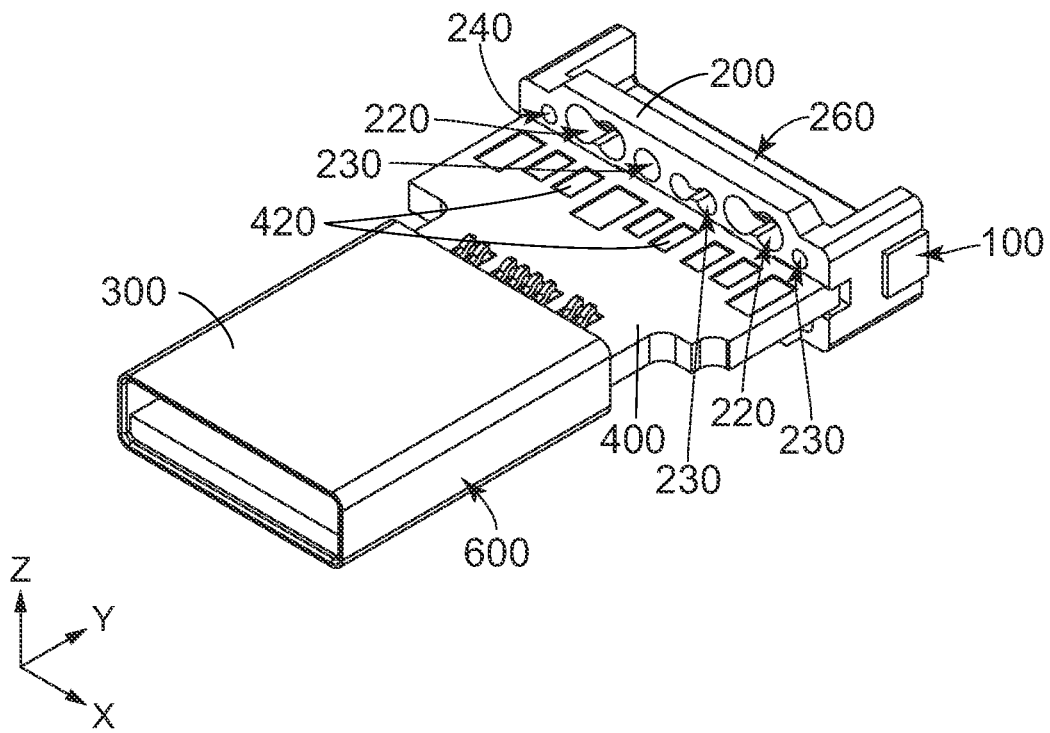
FIG. 3 is a perspective view showing a connector included in the harness of FIG. 2.

As shown in FIG. 3, the connector 600 of the present embodiment has a mating portion 300, a circuit board 400 and a locator 100.

Referring to FIG. 1, the mating portion 300 of the present embodiment is configured to be mated with a mating connector (not shown). The mating portion 300 defines a front end of the connector 600 in the front-rear direction.

Figure 4:
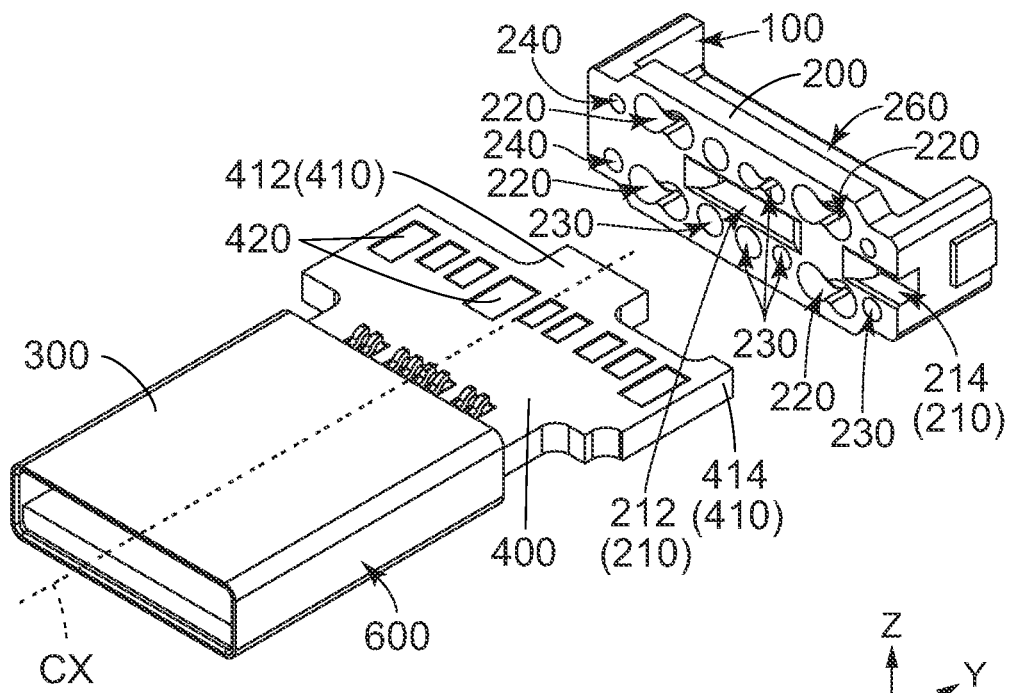
FIG. 4 is an exploded, perspective view showing the connector of FIG. 3.

As shown in FIG. 3, the circuit board 400 of the present embodiment is connected with the mating portion 300. Specifically, the circuit board 400 is connected with a rear end of the mating portion 300. As shown in FIG. 2, the circuit board 400 is positioned between the mating portion 300 and the composite cable 500 in the front-rear direction. The cables 510 of the composite cable 500 are connected with the circuit board 400. As shown in FIG. 4, the circuit board 400 has a plurality of accommodated portions 410 and a plurality of pads 420. However, the present invention is not limited thereto. The number of the accommodated portion 410 may be one. Each of the pads 420 is positioned around a rear end of the circuit board 400 in the front-rear direction. Referring to FIG. 2, the signal lines 522 of the first cables 520, the core wires 532 of the second cables 530 and the core wires 542 of the third cables 540 are connected with the pads 420.

As shown in FIG. 4, each of the accommodated portions 410 of the present embodiment protrudes rearward in the front-rear direction. The accommodated portions 410 are arranged asymmetrically to each other with respect to a vertical plane which is perpendicular to the pitch direction and which passes through a middle CX of the circuit board 400 in a pitch direction. In the present embodiment, the pitch direction is an X-direction. The accommodated portions 410 include a first accommodated portion 412 and a second accommodated portion 414.

As shown in FIG. 4, the first accommodated portion 412 of the present embodiment protrudes rearward in the front-rear direction. The first accommodated portion 412 is positioned at the middle of the circuit board 400 in the pitch direction. The first accommodated portion 412 defines a rear end of the circuit board 400 in the front-rear direction. The first accommodated portion 412 has a symmetric shape relative to the vertical plane which is perpendicular to the pitch direction and which passes through the middle CX of the circuit board 400 in the pitch direction.

As shown in FIG. 4, the second accommodated portion 414 of the present embodiment protrudes rearward in the front-rear direction. The second accommodated portion 414 is positioned at an outer end of the circuit board 400 in the pitch direction. A rear end of the second accommodated portion 414 is positioned forward in the front-rear direction beyond a rear end of the first accommodated portion 412.

As shown in FIG. 4, the first accommodated portion 412 and the second accommodated portion 414 are arranged asymmetrically to each other with respect to the vertical plane which is perpendicular to the pitch direction and which passes through the middle CX of the circuit board 400 in the pitch direction.

Figure 5:
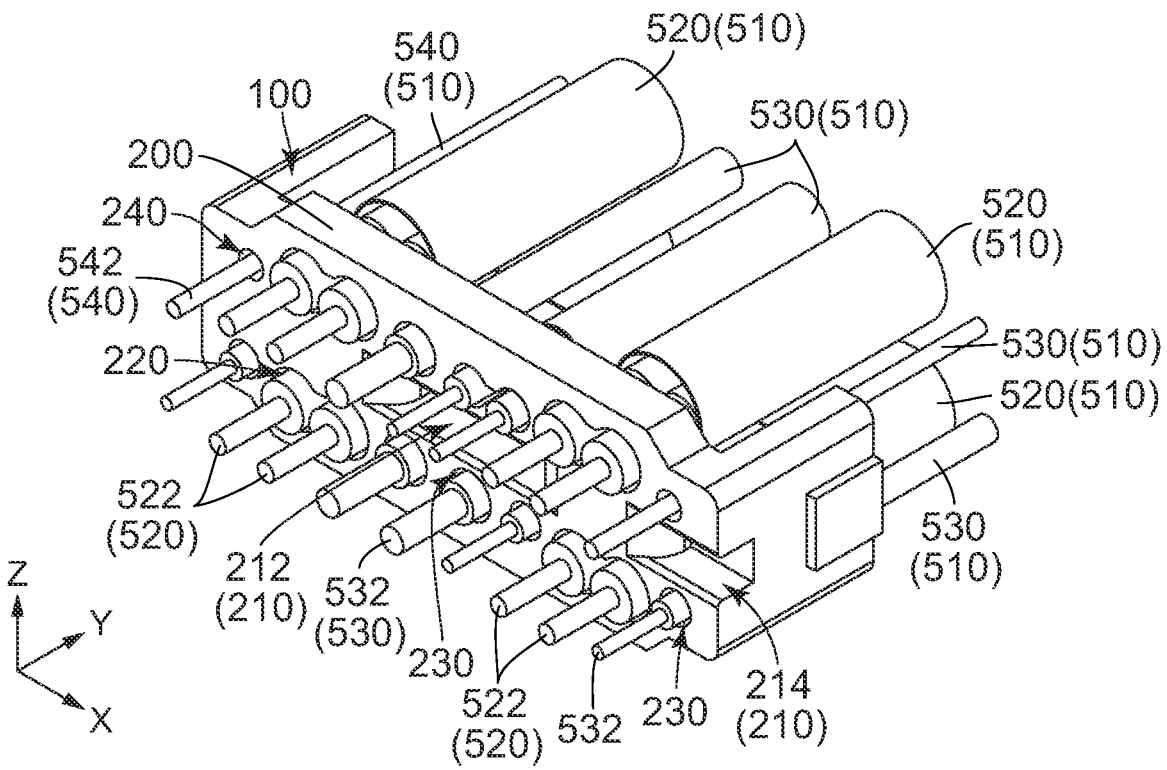
FIG. 5 is a front, perspective view showing a locator and the cables which are included in the harness of FIG. 2. In the figure, the first cables are held by first through holes of the locator, the second cables are held by second through holes of the locator and the third cables are held by third through holes of the locator.

As understood from FIG. 2, the locator 100 of the present embodiment aligns the cables 510 which are connected with the circuit board 400. As shown in FIG. 5, the cables 510 are aligned by the locator 100. The locator 100 is integrally molded from resin. The locator 100 is attached to the circuit board 400. The locator 100 comprises a main portion 200.

Figure 9:
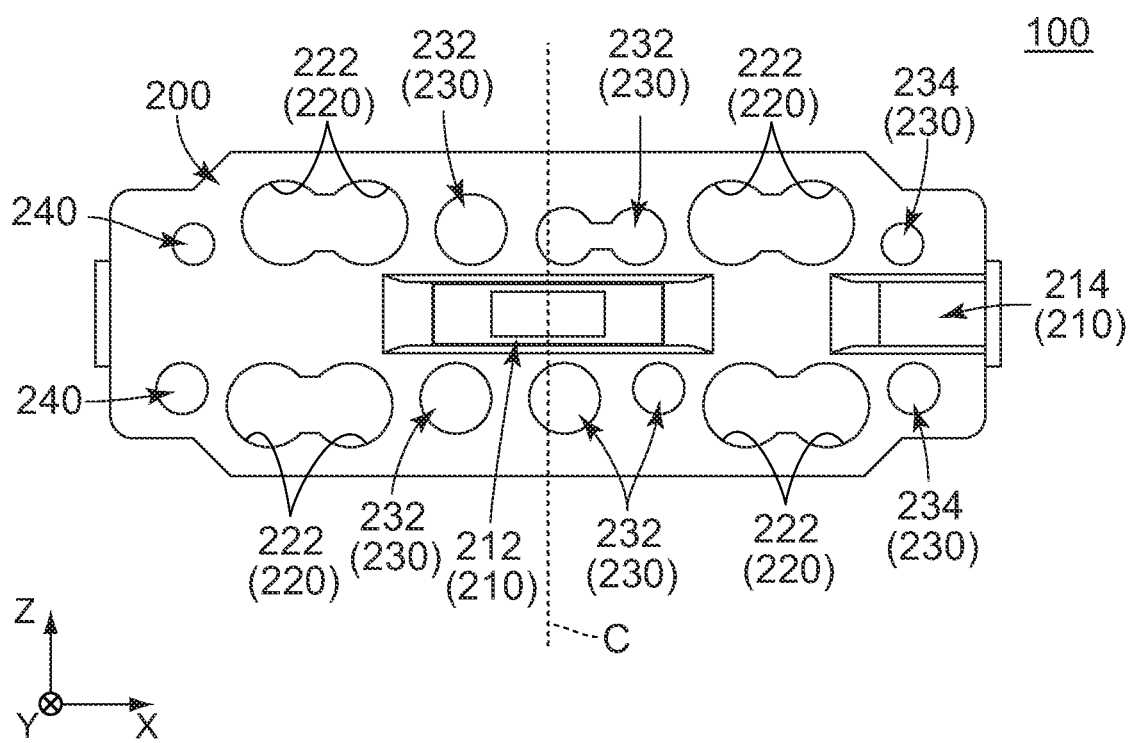
FIG. 9 is a front view showing the locator included in the connector of FIG. 4.

As shown in FIG. 7, the main portion 200 of the present embodiment extends in the pitch direction. The main portion 200 has a flat shape extending in a plane which is defined by the pitch direction and an up-down direction. In the present embodiment, the up-down direction is a Z-direction. Specifically, it is assumed that upward is a positive Z-direction while downward is a negative Z-direction. As shown in FIG. 9, the main portion 200 is formed with two circuit board accommodating portions 210. However, the present invention is not limited thereto. The main portion 200 should be, at least in part, formed with at least one circuit board accommodating portion 210. Additionally, the number of the circuit board accommodating portions 210 may be three or more. In order to prevent reverse insertion of the circuit board 400 into the locator 100, two or more of the circuit board accommodating portions 210 are preferred to be arranged asymmetrically to each other with respect to a vertical plane which is perpendicular to the pitch direction and which passes through a middle C of the locator 100 in the pitch direction.

Referring to FIGS. 3 and 4, the circuit board accommodating portions 210 of the present embodiment are configured to accommodate the accommodated portions 410, respectively, of the circuit board 400. More specifically, the accommodated portion 410 is accommodated in the circuit board accommodating portion 210 to be positioned both in the pitch direction and in the up-down direction. Each of the circuit board accommodating portions 210 opens forward in the front-rear direction perpendicular to the pitch direction. However, the present invention is not limited thereto. The circuit board accommodating portion 210 should open at least forward in the front-rear direction perpendicular to the pitch direction. Specifically, the circuit board accommodating portion 210 may open forward in the front-rear direction and downward in the up-down direction. In other words, the circuit board accommodating portion 210 may be configured so that a lower end of the circuit board accommodating portion 210 is not closed and communicates with the outside of the locator 100. If the circuit board accommodating portion 210 is configured in this way, the locator 100 may be attached to the circuit board 400 by inserting the accommodated portion 410 of the circuit board 400 into the circuit board accommodating portion 210 from below.

As shown in FIG. 9, the circuit board accommodating portions 210 include a first accommodating portion 212 and a second accommodating portion 214.

Referring to FIGS. 3 and 4, the first accommodating portion 212 of the present embodiment is configured to accommodate the first accommodated portion 412 of the circuit board 400. Specifically, the first accommodated portion 412 is accommodated in the first accommodating portion 212 to be positioned both in the pitch direction and in the up-down direction. The first accommodating portion 212 is a recess which is recessed rearward in the front-rear direction. As shown in FIG. 9, the first accommodating portion 212 has a symmetric shape relative to the vertical plane which is perpendicular to the pitch direction and which passes through the middle C of the locator 100 in the pitch direction. The first accommodating portion 212 is positioned at a middle of the main portion 200 in the pitch direction. The first accommodating portion 212 is positioned at a middle of the main portion 200 in the up-down direction. The first accommodating portion 212 opens forward in the front-rear direction perpendicular to the pitch direction. However, the present invention is not limited thereto. The first accommodating portion 212 should open at least forward in the front-rear direction perpendicular to the pitch direction. Specifically, the first accommodating portion 212 may open forward in the front-rear direction and downward in the up-down direction. Additionally, the first accommodating portion 212 may open forward and rearward in the front-rear direction. Furthermore, the first accommodating portion 212 may open forward and rearward in the front-rear direction and downward in the up-down direction.

Referring to FIGS. 3 and 4, the second accommodating portion 214 of the present embodiment is configured to accommodate the second accommodated portion 414 of the circuit board 400. Specifically, the second accommodated portion 414 is accommodated in the second accommodating portion 214 to be positioned both in the pitch direction and in the up-down direction. The second accommodating portion 214 is positioned at an outer end of the main portion 200 in the pitch direction. The second accommodating portion 214 is positioned at the middle of the main portion 200 in the up-down direction. The second accommodating portion 214 opens forward in the front-rear direction and outward in the pitch direction. However, the present invention is not limited thereto. The second accommodating portion 214 should open at least forward in the front-rear direction perpendicular to the pitch direction. Specifically, the second accommodating portion 214 may open forward in the front-rear direction and downward in the up-down direction. Additionally, the second accommodating portion 214 may open forward and rearward in the front-rear direction. Furthermore, the second accommodating portion 214 may open forward and rearward in the front-rear direction and downward in the up-down direction. In addition, the second accommodating portion 214 may not open outward in the pitch direction.

As shown in FIG. 9, the first accommodating portion 212 and the second accommodating portion 214 are positioned at positions same as each other in the up-down direction. The first accommodating portion 212 and the second accommodating portion 214 are arranged asymmetrically to each other with respect to the vertical plane which is perpendicular to the pitch direction and which passes through the middle C of the locator 100 in the pitch direction.

As shown in FIG. 9, the main portion 200 of the present embodiment is formed with a plurality of first through holes 220 and a plurality of second through holes 230. Specifically, each of the second through holes 230 is different from the first through hole 220. However, the present invention is not limited thereto. The main portion 200 should be formed with at least one first through hole 220 and at least one second through hole 230 which is different from the first through hole 220. The number of the first through holes 220 may be two or more.

As shown in FIG. 9, the first through holes 220 of the present embodiment are arranged in two rows in the up-down direction. The first through holes 220 of each row are arranged in the pitch direction. Each of the circuit board accommodating portions 210 is positioned between the two rows of the first through holes 220 in the up-down direction. The first accommodating portion 212 is positioned between the two rows of the first through holes 220 in the up-down direction. The second accommodating portion 214 is positioned between the two rows of the first through holes 220 in the up-down direction.

As shown in FIG. 9, each of the first through holes 220 is provided at a location which is different from any of locations of the circuit board accommodating portions 210 in the pitch direction. Each of the first through holes 220 is positioned outward of the first accommodating portion 212 in the pitch direction. Each of the first through holes 220 is provided at the location which is different from any of the locations of the circuit board accommodating portions 210 in the up-down direction. Specifically, the first through hole 220 of an upper row of the two rows is positioned above the circuit board accommodating portion 210 in the up-down direction. Additionally, the first through hole 220 of a lower row of the two rows is positioned below the circuit board accommodating portion 210 in the up-down direction.

As shown in FIGS. 7 and 8, each of the first through holes 220 pierces the main portion 200 in the front-rear direction. As shown in FIG. 9, each of the first through holes 220 is closed in a plane perpendicular to the front-rear direction.

Figure 6:
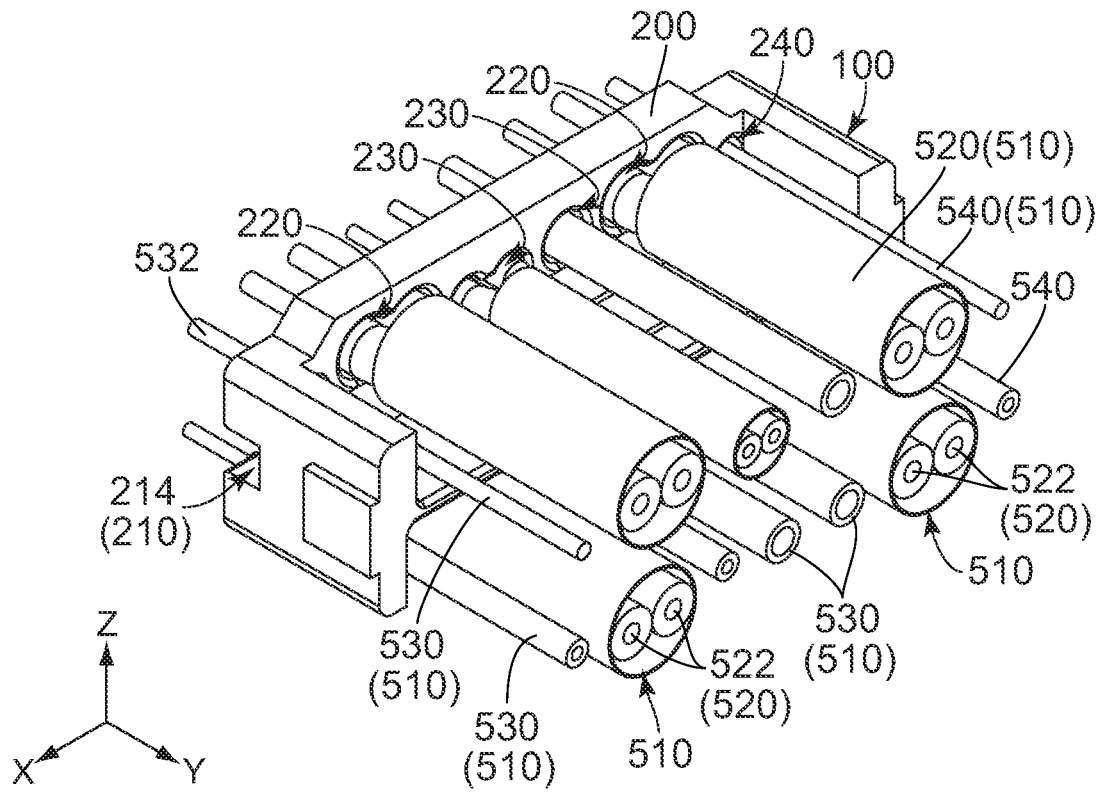
FIG. 6 is a rear, perspective view showing the locator and the cables of FIG. 5.

As shown in FIGS. 5 and 6, each of the first through holes 220 is configured to hold one of the cables 510 to position the one of the cables 510 both in the pitch direction and in the up-down direction which is perpendicular to both the pitch direction and the front-rear direction. Specifically, each of the first through holes 220 holds one of the first cables 520 to position the one of the first cables 520 both in the up-down direction and in the pitch direction. In other words, the first through hole 220 is used for the first cable 520. The first through holes 220 correspond to the first cables 520, respectively. Referring to FIGS. 5 and 9, each of the first through holes 220 has two first holding portions 222 which hold the paired signal lines 522, respectively, of the first cable 520.

As shown in FIG. 9, the two first holding portions 222 of the present embodiment are arranged in the pitch direction. The two first holding portions 222 communicate with each other in the pitch direction. In other words, the first through hole 220 of the present embodiment has a spectacle like shape, or a peanut-shape.

As described above, the locator 100 of the present embodiment is configured so that each of the first through holes 220 is provided at the location different from any of the locations of the circuit board accommodating portions 210 in the pitch direction. Accordingly, none of the circuit board accommodating portions 210 restrict a size of the first cable 520 which is held by the first through hole 220. Thus, without increasing a size of the locator 100 in the up-down direction, the locator 100 can align the first cable 520 with an increased outer diameter which corresponds to the first through hole 220. In other words, the locator 100 of the present embodiment can prevent the connector 600 from having an increased size even if the twisted pair lines of the first cable 520, which are connected to the connector 600, have increased outer diameters.

As shown in FIG. 9, the second through holes 230 of the present embodiment are arranged in two rows in the up-down direction. The second through holes 230 of each row are arranged in the pitch direction. Each of the circuit board accommodating portions 210 are positioned between the two rows of the second through holes 230 in the up-down direction. The first accommodating portion 212 is positioned between the two rows of the second through holes 230 in the up-down direction. The second accommodating portion 214 is positioned between the two rows of the second through holes 230 in the up-down direction. Each of the second through holes 230 is provided at a location which overlaps with one of the locations of the circuit board accommodating portions 210 in the pitch direction and which is different from any of the locations of the circuit board accommodating portions 210 in the up-down direction.

As shown in FIG. 9, the second through holes 230 of each row include second main through holes 232 and a second auxiliary through hole 234. Specifically, each of the second main through holes 232 is positioned around the middle of the main portion 200. The second auxiliary through hole 234 is positioned around the outer end of the main portion 200 in the pitch direction.

As shown in FIG. 9, each of the second main through holes 232 is provided at a location which overlaps with a location of the first accommodating portion 212 in the pitch direction. When the locator 100 is transparently viewed along the up-down direction, each of the second main through holes 232 overlaps with the first accommodating portion 212. Each of the second main through holes 232 is provided at the location which is different from the location of the first accommodating portion 212 in the up-down direction. Specifically, each of the second main through holes 232 of an upper row of the two rows is positioned just above the first accommodating portions 212 in the up-down direction. Additionally, each of the second main through holes 232 of a lower row of the two rows is positioned just below the first accommodating portions 212 in the up-down direction.

As shown in FIG. 9, each of the second auxiliary through holes 234 is provided at a location which overlaps with a location of the second accommodating portion 214 in the pitch direction. Each of the second auxiliary through holes 234 is provided at the location which is different from the location of the second accommodating portion 214 in the up-down direction. Specifically, the second auxiliary through hole 234 of the upper row of the two rows is positioned just above the second accommodating portion 214 in the up-down direction. Additionally, the second auxiliary through hole 234 of the lower row of the two rows is positioned just below the second accommodating portion 214 in the up-down direction.

As shown in FIGS. 7 and 8, each of the second through holes 230 pierces the main portion 200 in the front-rear direction. As shown in FIG. 9, each of the second through holes 230 is closed in the plane perpendicular to the front-rear direction. However, the present invention is not limited thereto. The second through hole 230 may open in the plane perpendicular to the front-rear direction.

As shown in FIGS. 5 and 6, each of the second through holes 230 is configured to hold one of the cables 510 to position the one of the cables 510 both in the pitch direction and in the up-down direction which is perpendicular to both the pitch direction and the front-rear direction. Specifically, each of the second through holes 230 holds one of the second cables 530 to position the one of the second cables 530 both in the up-down direction and in the pitch direction. In other words, the second through hole 230 is used for the second cable 530. The second through holes 230 correspond to the second cables 530, respectively.

As shown in FIG. 9, the main portion 200 of the present embodiment is provided with third through holes 240. Specifically, each of the third through holes 240 is different from any of the first through hole 220 and the second through hole 230. However, the present invention is not limited thereto. The main portion 200 may be provided with at least one third through hole 240 which is different from any of the first through hole 220 and the second through hole 230. In addition, the main portion 200 may have no third through hole 240.

As shown in FIG. 9, each of the third through holes 240 is provided at a location which is different from any of the locations of the circuit board accommodating portions 210 in the pitch direction. Each of the third through holes 240 is provided at the location which is different from any of the locations of the circuit board accommodating portions 210 in the up-down direction. The first through holes 220, the second through holes 230 and the third through holes 240 are arranged in two rows in the up-down direction. The first through holes 220, the second through holes 230 and the third through hole 240 of each row are arranged in the pitch direction.

As shown in FIGS. 7 and 8, each of the third through holes 240 pierces the main portion 200 in the front-rear direction. As shown in FIG. 9, each of the third through holes 240 is closed in the plane perpendicular to the front-rear direction.

As shown in FIGS. 7 and 8, each of the third through holes 240 is configured to hold one of the cables 510 to position the one of the cables 510 both in the up-down direction and in the pitch direction. Specifically, each of the third through holes 240 holds one of the third cables 540 to position the one of the third cables 540 both in the up-down direction and in the pitch direction. In other words, the third through hole 240 is used for the third cable 540. The third through holes 240 correspond to the third cables 540, respectively.

As shown in FIGS. 7 and 8, the locator 100 is provided with cable accommodating portions 260 each of which is positioned rearward of the main portion 200 in the front-rear direction. In other words, the locator 100 of the present embodiment further comprises the cable accommodating portions 260. The number of the cable accommodating portions 260 of the present embodiment is two. The cable accommodating portion 260 defines a rear end of the locator 100. The circuit board accommodating portion 210 extends to an inside of the cable accommodating portion 260. However, the present invention is not limited thereto. The circuit board accommodating portion 210 may partially extend to the inside of the cable accommodating portion 260.

Figure 10:
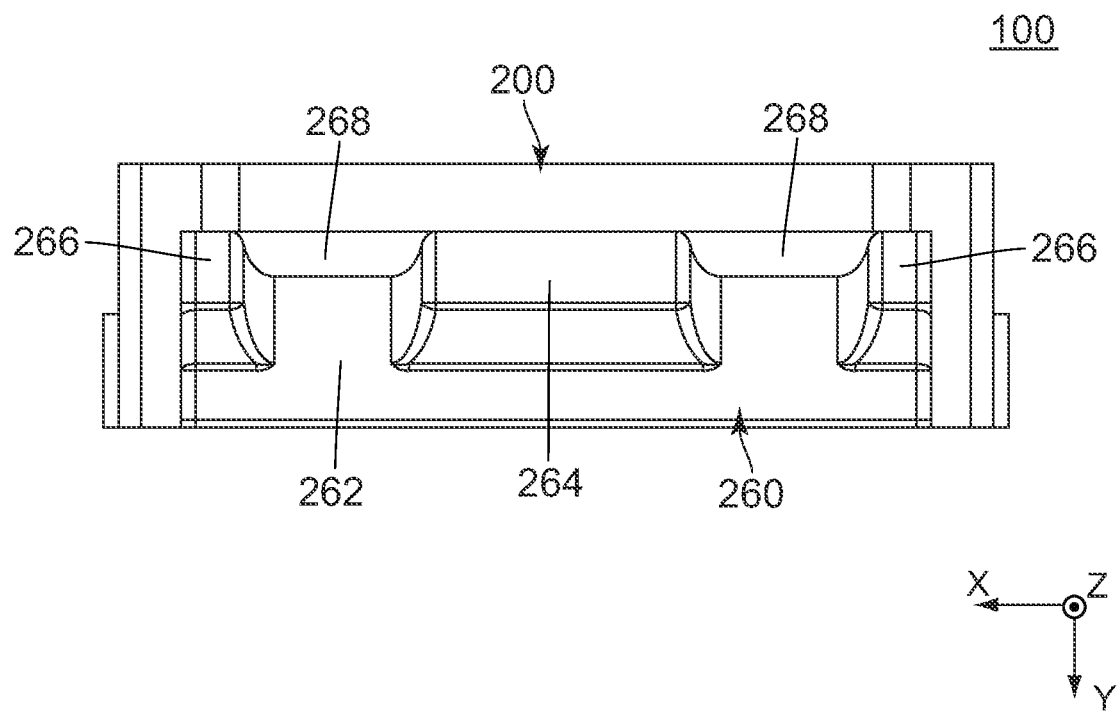
FIG. 10 is a top view showing the locator of FIG. 9.
Figure 11:
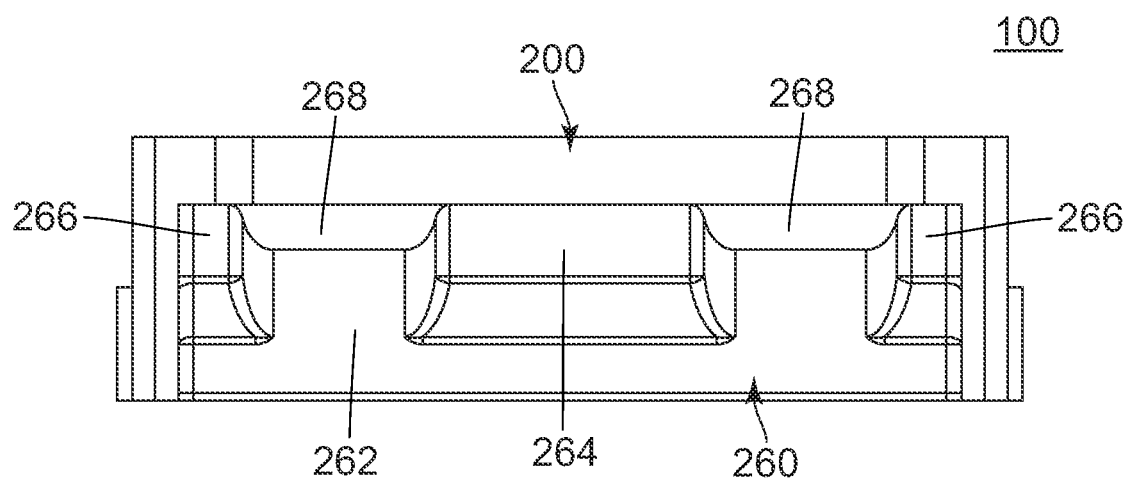
FIG. 11 is a bottom view showing the locator of FIG. 9.
Figure 11:
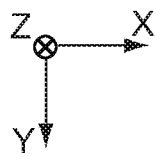
Figure 12:
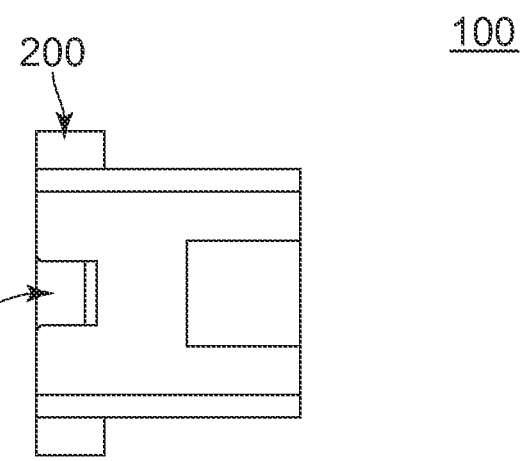
FIG. 12 is a side view showing the locator of FIG. 9.
Figure 12:
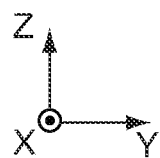
Figure 13:
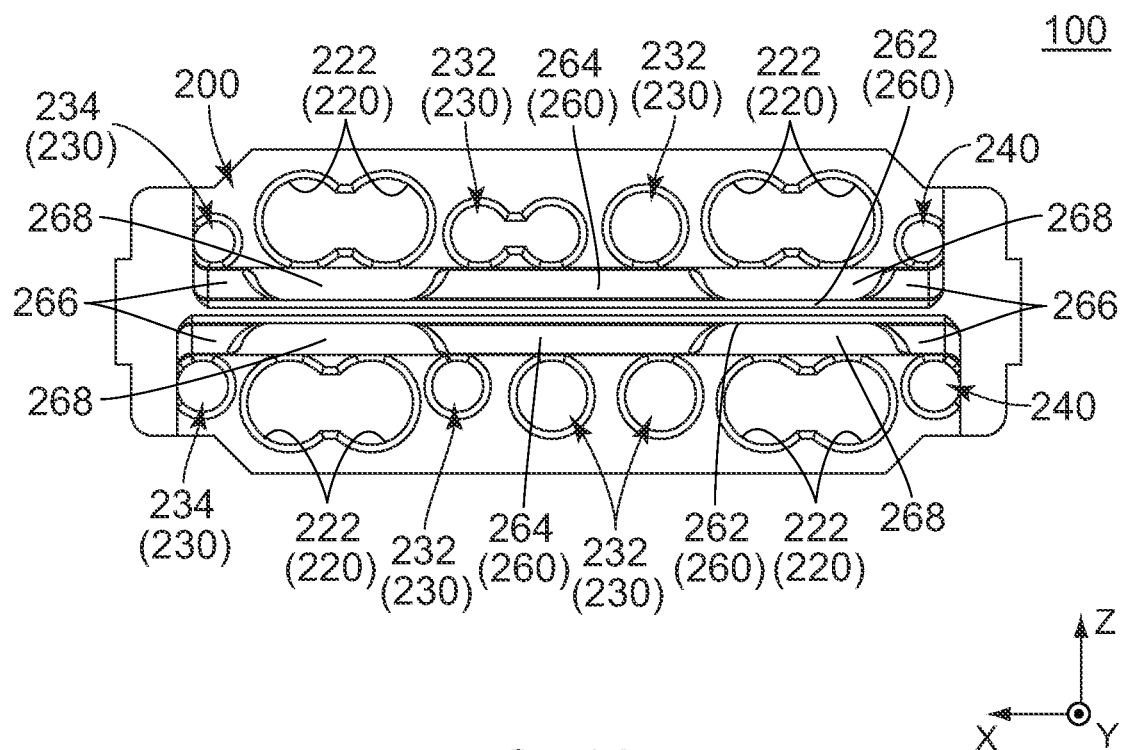
FIG. 13 is a rear view showing the locator of FIG. 9.

As shown in FIG. 13, the cable accommodating portions 260 correspond to the two rows, respectively, each including the first through holes 220, the second through holes 230 and the third through hole 240. As shown in FIGS. 10 and 11, each of the cable accommodating portions 260 has a flat portion 262, a bulge portion 264, two side portions 266 and two front walls 268.

As shown in FIGS. 10 and 11, the flat portion 262 of the present embodiment extends rearward in the front-rear direction from the main portion 200. The flat portion 262 defines a rear end of the cable accommodating portion 260. As shown in FIG. 13, the flat portion 262 has a flat-plate shape perpendicular to the up-down direction. If the number of the first through holes 220 is two or more as described above, it is sufficient that the flat portion 262 is positioned between two of the first through holes 220 in the up-down direction.

As shown in FIG. 13, the bulge portion 264 is bulged outward in the up-down direction from the flat portion 262. The bulge portion 264 is positioned at a middle of the cable accommodating portion 260 in the pitch direction. The bulge portion 264 is positioned between the flat portion 262 and the first through hole 220 in the up-down direction. The bulge portion 264 is positioned between the flat portion 262 and the second through hole 230 in the up-down direction. The bulge portion 264 is positioned between the flat portion 262 and the third through hole 240 in the up-down direction.

As shown in FIG. 13, each of the second main through holes 232 is provided at the location which overlaps with a location of the bulge portion 264 in the pitch direction. Each of the second main through holes 232 is provided at the location which is different from the location of the bulge portion 264 in the up-down direction. Specifically, the second main through hole 232 of the upper row is positioned above the bulge portion 264 of the cable accommodating portion 260 corresponding thereto in the up-down direction. Additionally, the second main through hole 232 of the lower row is positioned below the bulge portion 264 of the cable accommodating portion 260 corresponding thereto in the up-down direction.

As shown in FIGS. 10 and 11, the bulge portion 264 of the present embodiment extends rearward in the front-rear direction from the main portion 200. A rear end of the bulge portion 264 is portioned forward in the front-rear direction beyond a rear end of the flat portion 262. The flat portion 262 and the bulge portion 264 are coupled with each other in a horizontal plane which is defined by the front-rear direction and the pitch direction.

Referring to FIGS. 7 and 8, the circuit board accommodating portion 210 is partially provided in the bulge portion 264. Specifically, the first accommodating portion 212 is partially provided in the bulge portion 264. An upper part of the first accommodating portion 212 is covered with the bulge portion 264.

As shown in FIG. 13, each of the side portions 266 of the present embodiment extends outward in the up-down direction from the flat portion 262. The side portion 266 is positioned at an outer end of the cable accommodating portion 260 in the pitch direction. The side portion 266 is positioned outward of the first through hole 220 in the pitch direction. The side portion 266 is positioned between the flat portion 262 and the first through hole 220 in the up-down direction. The side portion 266 is positioned between the flat portion 262 and the second through hole 230 in the up-down direction. The side portion 266 is positioned between the flat portion 262 and the third through hole 240 in the up-down direction.

As shown in FIGS. 10 and 11, the side portion 266 extends rearward in the front-rear direction from the main portion 200. A rear end of the side portion 266 is positioned forward in the front-rear direction beyond the rear end of the flat portion 262. The rear end of the side portion 266 is positioned at a position same as a position of the rear end of the bulge portion 264 in the front-rear direction. The flat portion 262 and the side portion 266 are coupled with each other in the horizontal plane which is defined by the front-rear direction and the pitch direction. The bulge portion 264 is positioned between the two side portions 266 in the pitch direction.

As shown in FIG. 13, each of the front walls 268 of the present embodiment extends outward in the up-down direction from the flat portion 262. Each of the front walls 268 is positioned outward in the pitch direction beyond the bulge portion 264. The front wall 268 is positioned between the flat portion 262 and the first through hole 220 in the up-down direction. The front wall 268 is positioned between the flat portion 262 and the second through hole 230 in the up-down direction. The front wall 268 is positioned between the flat portion 262 and the third through hole 240 in the up-down direction.

As shown in FIG. 13, the first through holes 220 is provided at the location same as a location of the front wall 268 in the pitch direction. The first through hole 220 is provided at the location which is different from the location of the front wall 268 in the up-down direction. Specifically, the first through hole 220 of the upper row is positioned above the front wall 268 of the cable accommodating portion 260 corresponding thereto in the up-down direction. Additionally, the first through hole 220 of the lower row is positioned below the front wall 268 of the cable accommodating portion 260 corresponding thereto in the up-down direction.

As shown in FIGS. 10 and 11, the front wall 268 of the present embodiment is positioned rearward of the main portion 200 in the front-rear direction. The front wall 268 defines a front end of the cable accommodating portion 260 in the front-rear direction. A rear end of the front wall 268 is positioned forward in the front-rear direction beyond the rear end of the bulge portion 264. The rear end of the front wall 268 is positioned forward in the front-rear direction beyond the rear end of the side portion 266. The front wall 268 is positioned between the bulge portion 264 and the side portion 266 in the pitch direction.

Figure 14:
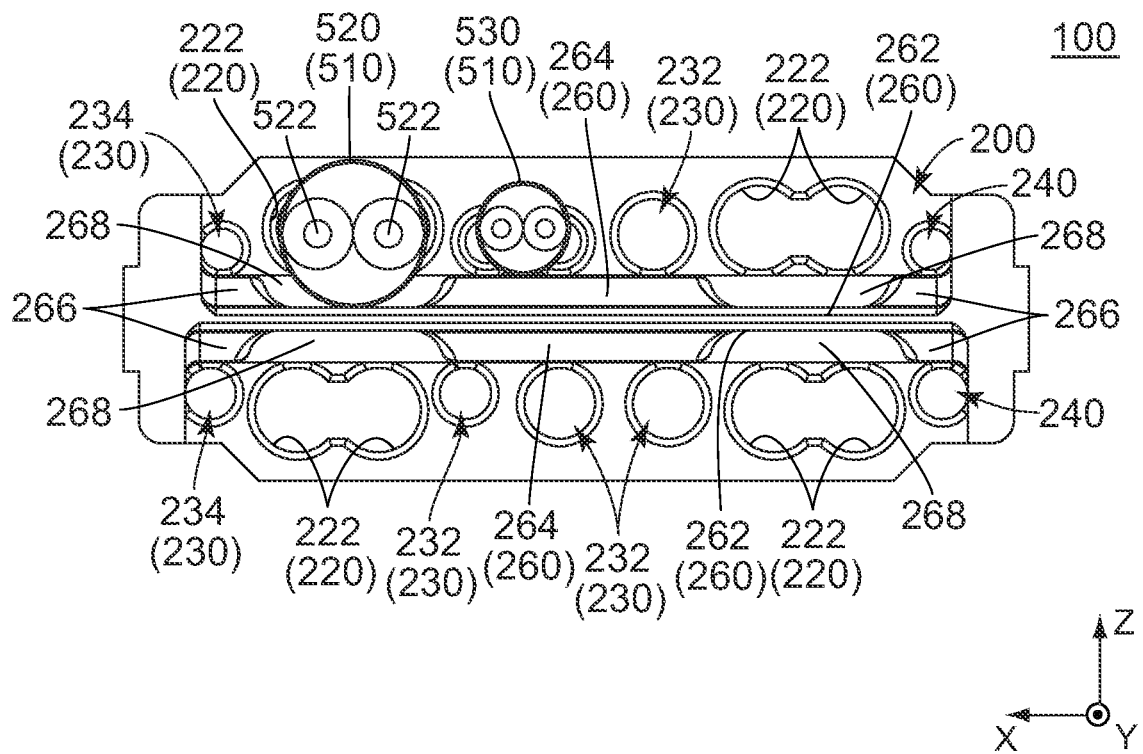
FIG. 14 is a rear view showing the locator and the cables of FIG. 5. In the figure, one of the first cables and one of the second cables are illustrated and remaining ones of the cables are omitted.
Figure 15:
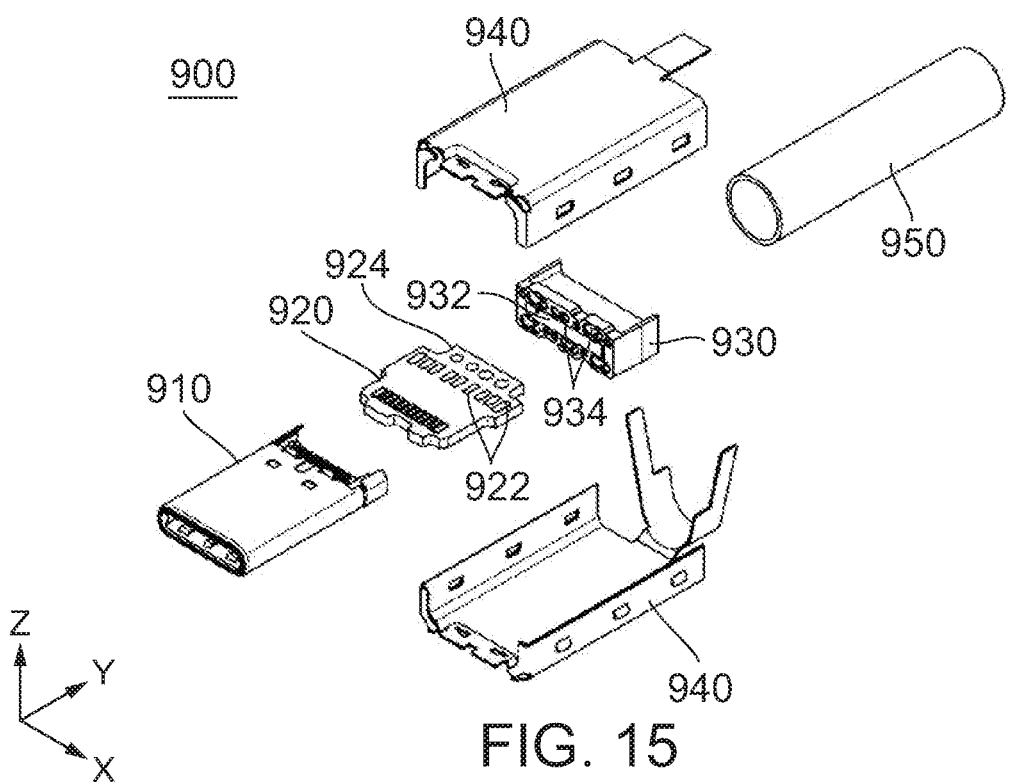
FIG. 15 is an exploded, perspective view showing a harness of Patent Document 1.
Figure 16:
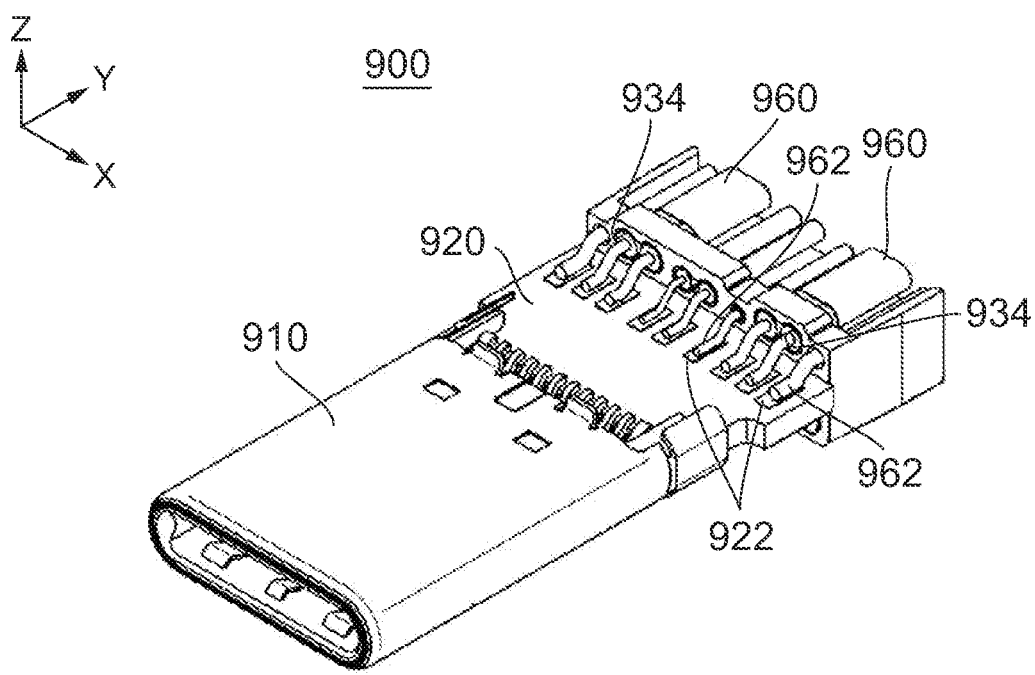
FIG. 16 is a perspective view showing the harness of FIG. 15. In the figure, a back shell is omitted.

Referring to FIGS. 1, 2 and 14, the harness 700 is configured so that the front wall 268 is positioned at a position same as a position of a part of the first cable 520 in the pitch direction. The harness 700 is configured so that the front wall 268 is positioned at the position same as the position of the part of the first cable 520 in the up-down direction.

Although the specific explanation about the present invention is made above referring to the embodiments, the present invention is not limited thereto and is susceptible to various modifications and alternative forms.

Although the locator 100 is integrally molded, the present invention is not limited thereto. Specifically, the locator 100 may be separable into an upper part and a lower part.

Although the locator 100 of the present embodiment comprises the main portion 200, which extends in the pitch direction, and the cable accommodating portions 260, the present invention is not limited thereto. Specifically, the locator 100 should comprise at least the main portion 200 which extends in the pitch direction. In other words, the locator 100 may comprise no cable accommodating portion 260.

Although the circuit board accommodating portions 210 of the present embodiment are configured so that the first accommodating portion 212 is positioned at the middle of the main portion 200 in the pitch direction while the second accommodating portion 214 is positioned at the outer end of the main portion 200 in the pitch direction, the present invention is not limited thereto. Specifically, the circuit board accommodating portions 210 may be arranged on the main portion 200 in the pitch direction in any fashion, provided that each of the first through holes 220 is provided at the location which is different from any of the locations of the circuit board accommodating portions 210 in the pitch direction.

Although the circuit board accommodating portions 210 of the present embodiment include the first accommodating portion 212 and the second accommodating portion 214, the present invention is not limited thereto. Specifically, the circuit board accommodating portion 210 may consist only of the first accommodating portion 212. In other words, the circuit board accommodating portion 210 may not include the second accommodating portion 214.

Although the first through holes 220, the second through holes 230 and the third through holes 240 are arranged in the two rows in the up-down direction, the present invention is not limited thereto. Specifically, the locator 100 may have only a single row formed of the first through holes 220, the second through holes 230 and the third through hole 240.

Although the first through hole 220 of the present embodiment is the hole with the spectacle like shape, the present invention is not limited thereto. Specifically, the first through hole 220 may be formed of two separate holes which are arranged in the pitch direction. In such a case, the paired signal lines 522 of the first cable 520 are held by the two separate holes, respectively.

Although the upper part of the first accommodating portion 212 of the present embodiment is covered with the bulge portion 264, the present invention is not limited thereto. Specifically, the first accommodating portion 212 may be formed as a cut which communicates with an upper space of the locator 100. In such a case, the first accommodated portion 412 of the circuit board 400 is visible from above when the circuit board 400 is attached to the locator 100.

Although the specific explanation about the present invention is made above referring to the embodiments, the present invention is not limited thereto and is susceptible to various modifications and alternative forms.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A locator for aligning cables which are configured to be connected with a circuit board having an accommodated portion, wherein:
   the locator comprises at least a main portion which extends in a pitch direction;
   the main portion is, at least in part, formed with at least one circuit board accommodating portion;
   the main portion is formed with at least one first through hole and at least one second through hole which is different from the first through hole;
   the at least one circuit board accommodating portion is configured to accommodate the accommodated portion of the circuit board;
   the at least one circuit board accommodating portion opens at least forward in a front-rear direction perpendicular to the pitch direction;
   each of the at least one first through hole and the at least one second through hole pierces the main portion in the front-rear direction;
   each of the at least one first through hole and the at least one second through hole holds one of the cables to position the one of the cables both in the pitch direction and in an up-down direction which is perpendicular to both the pitch direction and the front-rear direction;
   in the pitch direction, the at least one first through hole is provided at a location which is different from a location of the circuit board accommodating portion;
   the locator is provided with a cable accommodating portion which is positioned rearward of the main portion in the front-rear direction; and
   the circuit board accommodating portion partially extends to an inside of the cable accommodating portion;

the cable accommodating portion has a flat portion and a bulge portion;

each of the flat portion and the bulge portion extends rearward in the front-rear direction from the main portion;

the flat portion and the bulge portion are coupled with each other in a horizontal plane which is defined by the front-rear direction and the pitch direction;

the bulge portion is bulged outward in the up-down direction from the flat portion; and the circuit board accommodating portion is partially provided in the bulge portion; and the whole of the bulge portion is positioned between the flat portion and the first through hole in the up-down direction.

2. The locator as recited in claim 1, wherein the at least one second through hole is provided at a location which overlaps with the location of the circuit board accommodating portion in the pitch direction and which is different from the location of the circuit board accommodating portion in the up-down direction.

3. The locator as recited in claim 1, wherein:
the at least one first through hole includes two or more of the first through holes; and
the flat portion is positioned between two of the first through holes in the up-down direction.

4. The locator as recited in claim 1, wherein:
the at least one circuit board accommodating portion includes two or more of the circuit board accommodating portions; and
the two or more circuit board accommodating portions are arranged asymmetrically to each other with respect to a vertical plane which is perpendicular to the pitch direction and which passes through a middle of the locator in the pitch direction.

5. The locator as recited in claim 1, wherein the first through hole is closed in a plane perpendicular to the front-rear direction.

6. The locator as recited in claim 1, wherein:
the cables include a first cable and a second cable;
the first cable consists of twisted pair lines;
the second cable is different from the first cable;
the first through hole is used for the first cable; and
the second through hole is used for the second cable.

7. The locator as recited in claim 6, wherein:
the first through hole has two first holding portions which hold the twisted pair lines, respectively, of which the first cable consists; and
the two first holding portions are arranged in the pitch direction and communicate with each other in the pitch direction.

8. The locator as recited in claim 6, wherein:
the cables further include a third cable which is different from any of the first cable and the second cable;

the main portion is provided with at least one third through hole which is different from any of the first through hole and the second through hole;

the at least one third through hole pierces the main portion in the front-rear direction; and in the pitch direction, the at least one third through hole is provided at a location which is different from the location of the circuit board accommodating portion.

9. A connector comprising a mating portion, the circuit board and the locator as recited in claim 1, the mating portion being configured to be mated with a mating connector, the circuit board being connected with the mating portion, wherein:

the circuit board has the accommodated portion; and the accommodated portion is accommodated in the circuit board accommodating portion to be positioned both in the pitch direction and in the up-down direction.

10. A harness comprising a connector and a composite cable which is connected with the connector, wherein:
the connector comprises a mating portion, the circuit board and the locator as recited in claim 1;
the mating portion is configured to be mated with a mating connector;
the circuit board is connected with the mating portion;
the circuit board has the accommodated portion;
the accommodated portion is accommodated in the circuit board accommodating portion to be positioned both in the pitch direction and in the up-down direction;
the composite cable comprises the cables; and
the cables are aligned by the locator and are connected with the circuit board.

11. A harness comprising a connector and a composite cable which is connected with the connector, wherein:
the connector comprises a mating portion, the circuit board and the locator as recited in claim 6;
the mating portion is configured to be mated with a mating connector;
the circuit board is connected with the mating portion;
the circuit board has the accommodated portion;
the accommodated portion is accommodated in the circuit board accommodating portion to be positioned both in the pitch direction and in the up-down direction;
the composite cable comprises the cables;
the cables are aligned by the locator and are connected with the circuit board;
the cables include a first cable and a second cable;
the first cable consists of twisted pair lines;
the second cable is different from the first cable;
the first through hole corresponds to the first cable;
the second through hole corresponds to the second cable;
the first cable has a first outer diameter;
the second cable has a second outer diameter; and
the first outer diameter is greater than the second outer diameter.

* * * * *